United States Patent
Takahashi et al.

(10) Patent No.: US 9,171,737 B2
(45) Date of Patent: Oct. 27, 2015

(54) THERMAL OXIDE FILM FORMATION METHOD FOR SILICON SINGLE CRYSTAL WAFER

(75) Inventors: Hiroyuki Takahashi, Chikuma (JP); Kazuhiko Yoshida, Chikuma (JP)

(73) Assignee: SHIH-ETSU HANDOTAL CO., LTD., Tokyo (JP)

(*) Notice: Subject to any disclaimer, the term of this patent is extended or adjusted under 35 U.S.C. 154(b) by 102 days.

(21) Appl. No.: 13/824,028

(22) PCT Filed: Oct. 6, 2011

(86) PCT No.: PCT/JP2011/005626
§ 371 (c)(1),
(2), (4) Date: Mar. 15, 2013

(87) PCT Pub. No.: WO2012/063402
PCT Pub. Date: May 18, 2012

(65) Prior Publication Data
US 2013/0178071 A1      Jul. 11, 2013

(30) Foreign Application Priority Data

Nov. 10, 2010   (JP) .................................. 2010-251775

(51) Int. Cl.
   *H01L 21/316*   (2006.01)
   *H01L 21/02*    (2006.01)

(52) U.S. Cl.
   CPC .... *H01L 21/31662* (2013.01); *H01L 21/02238* (2013.01); *H01L 21/02255* (2013.01)

(58) Field of Classification Search
   CPC .............. H01L 21/0223; H01L 21/02233; H01L 21/02236; H01L 21/02238; H01L 21/02255; H01L 21/31662
   USPC ................................................. 438/787, 799
   See application file for complete search history.

(56) References Cited

U.S. PATENT DOCUMENTS

| | | | |
|---|---|---|---|
| 4,494,303 A | * | 1/1985 | Celler et al. ............ 438/413 |
| 5,009,926 A | * | 4/1991 | Fukuda .................... 427/557 |

(Continued)

FOREIGN PATENT DOCUMENTS

| | | |
|---|---|---|
| JP | A-11-186255 | 7/1999 |
| JP | A-2002-261094 | 9/2002 |

(Continued)

OTHER PUBLICATIONS

May 14, 2013 International Preliminary Report on Patentability issued in International Patent Application No. PCT/JP2011/005626.

(Continued)

*Primary Examiner* — Michele Fan
(74) *Attorney, Agent, or Firm* — Oliff PLC

(57) ABSTRACT

Disclosed is a method of forming a thermal oxide film on a silicon single crystal wafer, which includes throwing the silicon single wafer into a heat treatment furnace; elevating temperature of the heat treatment furnace up to a temperature T1 where a thermal oxide film is formed to form a thermal oxide film having a thickness d1; subsequently lowering the temperature of the heat treatment furnace down to a temperature lower than the temperature T1; and thereafter elevating the temperature of the heat treatment furnace up to a temperature T2 higher than the temperature T1 to additionally form a thermal oxide film having a thickness d2 thicker than the thickness d1. Thus, there is provided a thermal oxide film formation method to suppress occurrence of slip dislocation and/or crack of the silicon single wafer during formation of the thermal oxide film.

4 Claims, 3 Drawing Sheets

(56) References Cited

U.S. PATENT DOCUMENTS

| | | | |
|---|---|---|---|
| 5,648,282 A * | 7/1997 | Yoneda | 438/305 |
| 5,650,353 A * | 7/1997 | Yoshizawa et al. | 438/458 |
| 5,738,909 A * | 4/1998 | Thakur et al. | 427/255.4 |
| 5,786,277 A * | 7/1998 | Yamamoto | 438/770 |
| 5,851,892 A * | 12/1998 | Lojek et al. | 438/305 |
| 5,926,741 A * | 7/1999 | Matsuoka et al. | 438/778 |
| 5,962,854 A * | 10/1999 | Endo | 250/349 |
| 6,281,141 B1 * | 8/2001 | Das et al. | 438/770 |
| 6,291,365 B1 | 9/2001 | Koba | |
| 6,455,382 B1 * | 9/2002 | Lin et al. | 438/296 |
| 6,537,926 B1 * | 3/2003 | Schrems et al. | 438/770 |
| 6,541,394 B1 | 4/2003 | Chen et al. | |
| 6,797,323 B1 * | 9/2004 | Kashiwagi et al. | 427/255.29 |
| RE38,674 E * | 12/2004 | Chau et al. | 438/773 |
| 7,332,448 B2 * | 2/2008 | Terao | 438/795 |
| 2001/0017294 A1 * | 8/2001 | Aoki et al. | 219/390 |
| 2001/0050052 A1 * | 12/2001 | Moriyama | 118/715 |
| 2001/0052621 A1 * | 12/2001 | Beaman | 257/347 |
| 2003/0054596 A1 * | 3/2003 | Chen et al. | 438/197 |
| 2004/0009635 A1 | 1/2004 | Nakasato et al. | |
| 2004/0087180 A1 | 5/2004 | Hishiya et al. | |
| 2004/0185676 A1 * | 9/2004 | Hasegawa | 438/769 |
| 2004/0224531 A1 * | 11/2004 | You et al. | 438/769 |
| 2004/0235295 A1 * | 11/2004 | Dong et al. | 438/680 |
| 2006/0281234 A1 | 12/2006 | Sugiyama et al. | |
| 2010/0032710 A1 * | 2/2010 | Bui et al. | 257/127 |
| 2010/0044829 A1 | 2/2010 | Matsumine | |
| 2010/0144161 A1 * | 6/2010 | Nakamura | 438/767 |
| 2010/0184267 A1 * | 7/2010 | Kabe et al. | 438/400 |

FOREIGN PATENT DOCUMENTS

| | | | |
|---|---|---|---|
| JP | 2004064037 A * | 2/2004 | H01L 21/316 |
| JP | A-2004-064037 | 2/2004 | |
| JP | A-2007-053227 | 3/2007 | |
| JP | A-2008-277702 | 11/2008 | |

OTHER PUBLICATIONS

Dec. 27, 2011 International Search Report issued in International Application No. PCT/JP2011/005626.

Mar. 3, 2014 Extended Search Report issued in European Patent Application No. 11839425.3.

Oct. 8, 2013 Notification of Reasons for Refusal issued in Japanese Patent Application No. 2010-251775 (with partial translation).

Mar. 18, 2015 Office Action and Search Report issued in Chinese Patent Application No. 2011800542512.

* cited by examiner

THERMAL OXIDE FILM FORMATION METHOD FOR SILICON SINGLE CRYSTAL WAFER

TECHNICAL FIELD

The present invention relates to a thermal oxide film formation method for suppressing slip dislocation, etc. taking place when thermal oxide film is formed on a silicon single crystal wafer.

BACKGROUND TECHNOLOGY

Hitherto, in order to form a thermal oxide film on the surface of a silicon single crystal wafer, e.g., silicon single crystal wafer is mounted on a heat treatment jig (frequently referred to as wafer boat) made of heat resistant material (e.g., quartz or SiC) to set such a jig within a tube for heat treatment furnace to perform heat treatment under oxidizing atmosphere.

Control of film thickness of the thermal oxide film formed in this way is performed after subjected to calculation by the kind of the heat treatment atmosphere, the heat treatment temperature and/or heat treatment time.

In regard to film thickness of thermal oxide film to be formed on the surface of the silicon single crystal wafer, although depending upon the purpose, in the case of fabricating a bonded SOI wafer including a thick buried oxide film layer (BOX layer) as described in the Patent Literature 1, a thick thermal oxide film is formed on at least one of two silicon single crystal wafers to be bonded and a bonding process is performed.

For the purpose of forming such a thick oxide film, high temperature/long time heat treatment is performed under the atmosphere including water vapor such as wet $O_2$ oxidation or pyrogenic oxidation, etc. as the heat treatment atmosphere where oxidation rate is high.

CITATION LIST

Patent Literature

Patent Literature 1: Japanese Unexamined Patent Publication (Kokai) No. 2008-277702

SUMMARY OF THE INVENTION

Problems to be Solved by the Invention

Particularly, in forming a thick thermal oxide film, when high temperature/long time heat treatment is performed under the atmosphere including water vapor, the thermal oxide film formed on the surface of the silicon single crystal wafer is stuck onto a wafer boat. For this reason, there was the problem that slip dislocation and/or crack may take place at the part thereof.

The present invention has been made in view of the above-described problems, and aims at providing a method of forming a thermal oxide film of preventing sticking onto a wafer boat taking place particularly in forming s thick oxide film to have ability to suppress occurrence of slip dislocation and/or crack of a silicon single crystal wafer during formation of the thermal oxide film.

Means for Solving the Problems

To attain the above-mentioned problems, the present invention provides a method of forming a thermal oxide film on a silicon single crystal wafer, at least comprising: throwing the silicon single crystal wafer into a heat treatment furnace; elevating temperature of the heat treatment furnace up to a temperature T1 where a thermal oxide film is formed to form a thermal oxide film having a thickness d1; subsequently lowering the temperature of the heat treatment furnace down to a temperature lower than the temperature T1; and thereafter elevating the temperature of the heat treatment furnace up to a temperature T2 higher than the temperature T1 to additionally form a thermal oxide film having a thickness d2 thicker than the thickness d1.

By forming the thermal oxide film in this way, warp phenomenon of wafer takes place resulting from a temperature difference between a wafer outer peripheral part and a central part occurring at the time of lowering temperature, and therefore a position in contact with a wafer boat for holding the wafer changes. For this reason, it is possible to prevent that the wafer is stuck onto the wafer boat by the thermal oxide film. Moreover, the thermal oxide film formed during oxidation at the temperature T1 of the preceding stage has the effect of the protective film in high temperature oxidation performed at the temperature T2 of the succeeding stage. Further, a thick oxide film is additionally formed by high temperature oxidation of the succeeding stage, while suppressing occurrence of the slip dislocation and/or crack in the state where the contact position is changed and the thermal oxide film as the protective film is formed at the preceding stage. Therefore, it is possible to efficiently form satisfactory thick thermal oxide film.

At this time, it is preferable that the temperature of the heat treatment furnace is elevated up to the temperature T2 higher than the temperature T1 without taking out the silicon single crystal wafer from the heat treatment furnace to additionally form a thermal oxide film having the thickness d2 thicker than the thickness d1 after the temperature of the heat treatment furnace is lowered down to the temperature lower than the temperature T1.

The thermal oxide film is additionally formed as described above, thereby making it possible to additionally form the thermal oxide film continuously within the heat treatment furnace. Such a process is efficient.

At this time, it is preferable that the temperature T1 is set to a temperature lower than 1200° C., and the temperature T2 is set to a temperature of 1200° C. or more.

As described above, the temperature T1 is set to a temperature lower than 1200° C., thereby making it possible to form a thermal oxide film while effectively preventing occurrence of slip dislocation by the low temperature oxidation of the preceding stage. Moreover, the temperature T2 is set to a temperature of 1200° C. or more, thereby making it possible to efficiently form thick thermal oxide film by the high temperature oxidation of the succeeding stage at a sufficient oxidation rate.

At this time, it is preferable that when the temperature of the heat treatment furnace is lowered down to the temperature lower than the temperature T1, the temperature of the heat treatment furnace is lowered down to a temperature lower than the temperature T1 by 200° C. or more.

As described above, the temperature of the heat treatment furnace is lowered down to the temperature lower than the temperature T1 by 200° C. or more, thereby making it possible to allow warp phenomenon of the wafer at time of lowering temperature to sufficiently take place to change the position in contact with the wafer boat thus to effectively prevent sticking.

At this time, it is preferable that when the temperature of the heat treatment furnace is lowered down to the temperature lower than the temperature T1, the temperature of the heat treatment furnace is lowered down to a temperature equal to or less than a throw-in temperature when the silicon single crystal wafer is thrown into the heat treatment furnace.

As described above, the temperature of the heat treatment furnace is lowered down to a temperature equal to or less than a throw-in temperature when the silicon single crystal wafer is thrown into the heat treatment furnace, thereby making it possible to allow warp phenomenon of the wafer at the time of lowering temperature to sufficiently take place to change the position in contact with the wafer boat to securely prevent sticking.

At this time, a film thickness obtained by totalizing the thickness d1 and the thickness d2 may be 2500 nm or more.

Also in forming such a thick thermal oxide film, in accordance with the method according to the present invention, it is possible to prevent occurrence of slip dislocation thus to perform satisfactory formation of the thermal oxide film.

At this time, it is preferable that the thickness d1 is 500 nm or more.

As described above, the thickness d1 is 500 nm or more so that the thermal oxide film thus formed functions as a satisfactory protective film in high temperature oxidation of the succeeding stage to securely prevent occurrence of the slip dislocation.

At this time, it is preferable that after the thermal oxide film having the thickness d2 is additionally formed, further additional formation of a thermal oxide film by lowering the temperature of the heat treatment furnace down to a temperature lower than the temperature T1 and thereafter elevating the temperature of the heat treatment furnace up to a temperature higher than the temperature T1 is repeated one or more times.

The thermal oxide film is additionally formed as described above, thereby making it possible to securely prevent sticking onto the wafer boat particularly in forming a thick thermal oxide film.

Advantageous Effects of the Invention

As described above, in accordance with the present invention, it is possible to efficiently perform thermal oxide film formation while suppressing occurrence of slip dislocation and/or crack particularly also in forming a thick thermal oxide film.

BEST MODE FOR CARRYING OUT THE INVENTION

Figure 1:
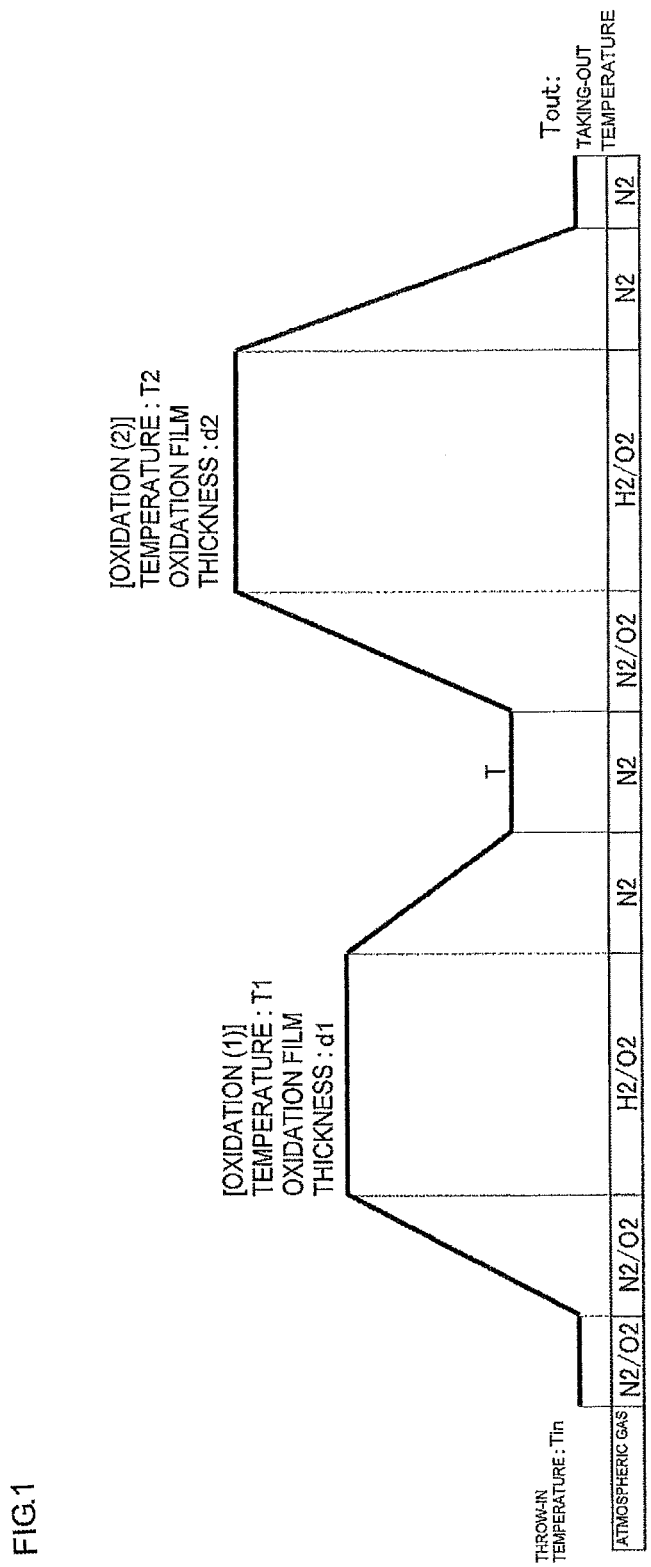
FIG. 1 is a view showing temperature and atmospheric gas within a heat treatment furnace in an example.

While the present invention will now be described in detail with reference to the drawings as an example of preferred embodiments, the present invention is not limited to such an implementation.

In the present invention, a silicon single crystal wafer is first thrown into, e.g., a longitudinal heat treatment furnace.

In this instance, wafers are filled into a wafer boat having supporting parts for mounting a plurality of wafers thereon to perform loading the wafer boat into a tube of the heat treatment furnace to thereby throw them thereinto. As temperature (throw-in temperature) within the heat treatment furnace at this time, a heater is set so that there is provided, e.g., temperature of about 500° C.

Next, the temperature of the heat treatment furnace is elevated up to the temperature T1 where a thermal oxide film is formed to hold such temperature to thereby form a thermal oxide film having thickness d1.

At this time, as long as the temperature of the heat treatment furnace is a temperature such that thermal oxide film can be formed on a silicon single crystal wafer, the temperature T1 where the thermal oxide film is formed is not particularly limited. In this case, when the temperature of the heat treatment furnace is a temperature higher than 600° C., a thermal oxide film having a certain thickness is formed, but it is preferable that, e.g., the temperature T1 is a temperature lower than 1200° C. When the temperature of the heat treatment furnace is a temperature lower than 1200° C., it is possible to sufficiently suppress occurrence of the slip dislocation during formation of the thermal oxide film.

The thickness d1 of the thermal oxide film to be formed at this time is not particularly limited, but e.g., a thickness of 500 nm or more is preferable.

The thermal oxide film having such a thickness is formed, whereby the thermal oxide film has a thickness to a degree such that the thermal oxide film sufficiently functions as a protective film in high temperature oxidation of the succeeding stage, thus making it possible to sufficiently suppress occurrence of the slip dislocation.

Next, the temperature of the heat treatment furnace is lowered down to a temperature lower than the temperature T1.

In this way, the temperature of the heat treatment furnace is lowered so that a temperature difference takes place between the outer peripheral part of the wafer and the central part thereof. As a result, warp phenomenon takes place at the wafer resulting from the temperature difference. Thus, the position in contact with the wafer boat changes. For this reason, it can be prevented that the wafer may be stuck onto the wafer boat by the thermal oxide film formed.

In this instance, it is preferable that the temperature of the heat treatment is lowered down to a temperature lower than the temperature T1 by 200° C. or more. Moreover, it is more preferable that the temperature of the heat treatment furnace is lowered down to a temperature equal to or less than a throw-in temperature when the silicon single crystal wafer is thrown into the heat treatment furnace.

When the temperature of the heat treatment furnace is lowered down to such a temperature, warp phenomenon of the wafer is caused to sufficiently take place, thereby making it possible to securely attain sticking prevention based on change of the position in contact with the wafer boat.

Next, the temperature of the heat treatment furnace is elevated up to a temperature T2 higher than the temperature T1 to additionally form a thermal oxide film having thickness d2 thicker than the thickness d1.

In this way, in the high temperature oxidation process of the succeeding stage, because the thermal oxide film is already formed at the low temperature oxidation process of the preceding stage, this thermal oxide film functions as a protective film so that slip dislocation is difficult to occur even at a high temperature. Moreover, when a thermal oxide film having thickness d2 thicker than that of the low temperature oxidation of the preceding stage in high temperature oxidation, since the oxidation rate is high due to high temperature, it is possible to efficiently and additionally form thick thermal oxide film.

The temperature T2 at this time may be a temperature higher than the temperature T1, but is not particularly limited. In this case, for example, it is preferable that the temperature T2 is 1200° C. or more.

When the temperature T2 is 1200° C. or more, since the oxidation rate is sufficiently high, such a process is efficient. Moreover, even when the temperature T2 is such a high temperature, since the thermal oxide film is formed by the low temperature oxidation of the preceding stage in the present invention, such thermal oxide film functions as a protective film so that slip dislocation is difficult to take place.

Moreover, while a wafer can be taken out toward the outside of the heat treatment furnace before the temperature of the heat treatment furnace is elevated up to the temperature T2 after the temperature of the heat treatment furnace is lowered, it is preferable that if the throughput of the oxidation process is taken into account, the temperature of the heat treatment furnace is elevated up to the temperature T2 without taking out the wafer toward the outside of the heat treatment furnace to continuously perform formation of the oxide film after the temperature of the heat treatment furnace is lowered.

Such temperature elevation, temperature lowering and temperature holding within the heat treatment furnace may be performed by controlling heater output. Moreover, temperature-elevating rate and temperature-lowering rate are not particularly limited.

Further, as long as the atmosphere in formation of a thermal oxide film is oxidizing atmosphere where the oxide film is formed, the atmosphere is not also particularly limited, and e.g., wet $O_2$ oxidation and/or pyrogenic oxidation, etc. may be performed under the atmosphere including vapor water.

According to the thermal oxide film formation method of the present invention as described above, occurrence of slip dislocation and/or crack is prevented also in forming a thick thermal oxide film having thickness of 2500 nm or more, otherwise 5000 nm or more where slip dislocation, etc. is apt to particularly take place, and thus a satisfactory thermal oxide film can be formed.

Moreover, the thermal oxide film having the thickness d2 is additionally formed in a manner as described above, further additional formation of a thermal oxide film by lowering the temperature of the heat treatment furnace down to a temperature lower than the temperature T1 and thereafter elevating the temperature of the heat treatment furnace up to a temperature higher than the temperature T1 is repeated one or more times.

Particularly in the case of forming a thick thermal oxide film, etc., temperature lowering and temperature elevation of the present invention may be repeated further one or more times in this way to thereby prevent sticking onto the wafer boat, thus making it possible securely prevent slip dislocation and/or crack.

It is to be noted that the oxide film formation method according to the present invention may be also applied to a bonded SOI wafer made by bonding two ordinary silicon single crystal wafers through the oxide film, and to a SOI wafer fabricated through high temperature heat treatment after oxygen ions are implanted into an ordinary silicon single crystal wafer, in addition to ordinary silicon single crystal wafer comprised of only silicon single crystal. Accordingly, "silicon single crystal wafer" in the present invention may include these SOI wafers.

EXAMPLES

While the present invention will be described in more concrete manner by making reference to the examples and the comparative examples, the present invention is not limited to these examples.

Example 1

A mirror polished silicon single crystal wafer having a diameter of 200 mm and crystal orientation <100> was thrown into a longitudinal heat treatment furnace to form a thermal oxide film having a thickness of 6000 nm by the heat treatment profile of FIG. 1. In the Table 1, there are shown throw-in temperature Tin(° C.), low temperature oxidation temperature T1(° C.), lowered temperature T(° C.), high temperature oxidation temperature T2(° C.) and taking-out temperature Tout(° C.) in this instance.

The oxidation is performed by the pyrogenic oxidation. In the case of the low temperature oxidation (oxidation 1), oxidation time was adjusted so that a thermal oxidation film having a thickness of 1000 nm is formed. In the case of the high temperature oxidation (oxidation 2), oxidation time was adjusted so that a thermal oxidation film having a thickness of 5000 nm is additionally formed.

The temperature-elevating rate from Tin(° C.) to T1(° C.) was set to 5(° C./min), and the temperature-lowering rate from Tin(° C.) to T(° C.) was set to 2.5(° C./min).

Moreover, the temperature-elevating rate from T(° C.) to T2(° C.) was set to 2(° C./min) until 900° C., was set to 1(° C./min) between 900° C. and 1200(° C.), and was set to 0.5(° C./min) between 1200 and 1250(° C.). The temperature-lowering rate from T2(° C.) to Tout(° C.) was set to 0.5(° C./min) until 1200° C., was set to 1(° C./min) between 1200 and 1100(° C.), and was set to 2(° C./min) between 1100 and Tout(° C.).

The thermal oxide film having a thickness of 6000 nm was formed thereafter to observe the slip dislocation by the X-ray topography method. As a result, at the position in contact with the wafer boat, contact trace was observed, but linear slip dislocation was not observed.

Example 2

A mirror polished silicon single crystal wafer having a diameter of 200 mm and crystal orientation <100> was thrown into a longitudinal heat treatment furnace to form a thermal oxide film having a thickness of 5500 nm by the heat treatment profile of FIG. 1. In the Table 1, there are shown throw-in temperature Tin(° C.), low temperature oxidation temperature T1(° C.), lowered temperature T(° C.), high temperature oxidation temperature T2(° C.) and taking-out temperature Tout(° C.) in this instance.

The oxidation was performed by the pyrogenic oxidation. In the case of the low temperature oxidation (oxidation 1), oxidation time was adjusted so that a thermal oxide film having a thickness of 500 nm is formed. In the case of the high temperature oxidation (oxidation 2), oxidation time was adjusted so that a thermal oxidation film having a thickness of 5000 nm is additionally formed.

The temperature-elevating rate from Tin(° C.) to T1(° C.) was set to 5(° C./min), and the temperature-lowering rate from T1(° C.) to T(° C.) was set to 2.5(° C./min).

Moreover, the temperature-elevating rate from T(° C.) to T2(° C.) was set to 2(° C./min) until 900° C., was set to 1(° C./min) between 900° C. and 1200(° C.), and was set to 0.5(° C./min) between 1200 and 1250(° C.). The temperature-lowering rate from T2(° C.) to Tout(° C.) was set to 0.5(° C./min) until 1200° C., was set to 1(° C./min) between 1200 and 1100(° C.), and was set to 2(° C./min) between 1100 and Tout(° C.).

The thermal oxide film having a thickness of 5500 nm was formed thereafter to observe the slip dislocation by the X-ray topography method. As a result, at the position in contact with the wafer boat, contact trace was observed, but linear slip dislocation was not observed.

Example 3

A mirror polished silicon single crystal wafer having a diameter of 200 mm and crystal orientation <100> was thrown into a longitudinal heat treatment furnace to form an oxide film having a thickness of 2500 nm by the heat treatment profile of FIG. 1. In the table 1, there are shown throw-in temperature Tin(° C.), low temperature oxidation temperature T1(° C.), lowered temperature T(° C.), high temperature oxidation temperature T2(° C.) and taking-out temperature Tout(° C.) in this instance.

The oxidation is performed by the pyrogenic oxidation. In the case of the low temperature oxidation (oxidation 1), oxidation time was adjusted so that a thermal oxidation film having a thickness of 500 nm is formed. In the case of the high temperature oxidation (oxidation 2), oxidation time was adjusted so that a thermal oxidation film having a thickness of 2000 nm is additionally formed.

The temperature-elevating rate from Tin(° C.) to T1(° C.) was set to 5(° C./min), and the temperature-lowering rate from T1(° C.) to T(° C.) was set to 2.5(° C./min).

Moreover, the temperature-elevating rate from T(° C.) to T2(° C.) was set to 2(° C./min) until 900° C., and was set to 1 (° C./min) between 900° C. and 1200(° C.). The temperature-lowering rate from T2(° C.) to Tout(° C.) was set to 1(° C./min) until 1100° C., and was set to 2(° C./min) between 1100 and Tout(° C.).

The thermal oxide film having a thickness of 2500 nm was formed thereafter to observe the slip dislocation by the X-ray topography method. As a result, at the position in contact with the wafer boat, contact trace was observed, but linear slip dislocation was not observed.

The temperatures at the time of forming thermal oxide film in Examples 1-3 are shown in Table 1, and the thermal oxide film thicknesses in Examples 1-3 are shown in Table 2.

TABLE 1

|  | Tin (° C.) | T1 (° C.) | T (° C.) | T2 (° C.) | Tout (° C.) |
|---|---|---|---|---|---|
| Example 1 | 500 | 1050 | 500 | 1250 | 500 |
| Example 2 | 600 | 1000 | 800 | 1250 | 600 |
| Example 3 | 500 | 1000 | 500 | 1200 | 500 |

TABLE 2

|  | Oxidation (1) d1 (nm) | Oxidation (2) d2 (nm) | Total oxide film thickness |
|---|---|---|---|
| Example 1 | 1000 | 5000 | 6000 nm |
| Example 2 | 500 | 5000 | 5500 nm |
| Example 3 | 500 | 2000 | 2500 nm |

Example 4

A thermal oxide film having a thickness of 6000 nm was formed under the same condition as that of the example 1 except for the fact that the wafer is once taken out toward the outside of the heat treatment furnace after temperature lowering down to T(° C.).

The thermal oxide film having a thickness of 6000 nm was formed thereafter to observe the slip dislocation by the X-ray topography method. As a result, at the position in contact with the wafer boat, contact trace was observed, but linear slip dislocation was not observed.

Comparative Example 1

Figure 2:
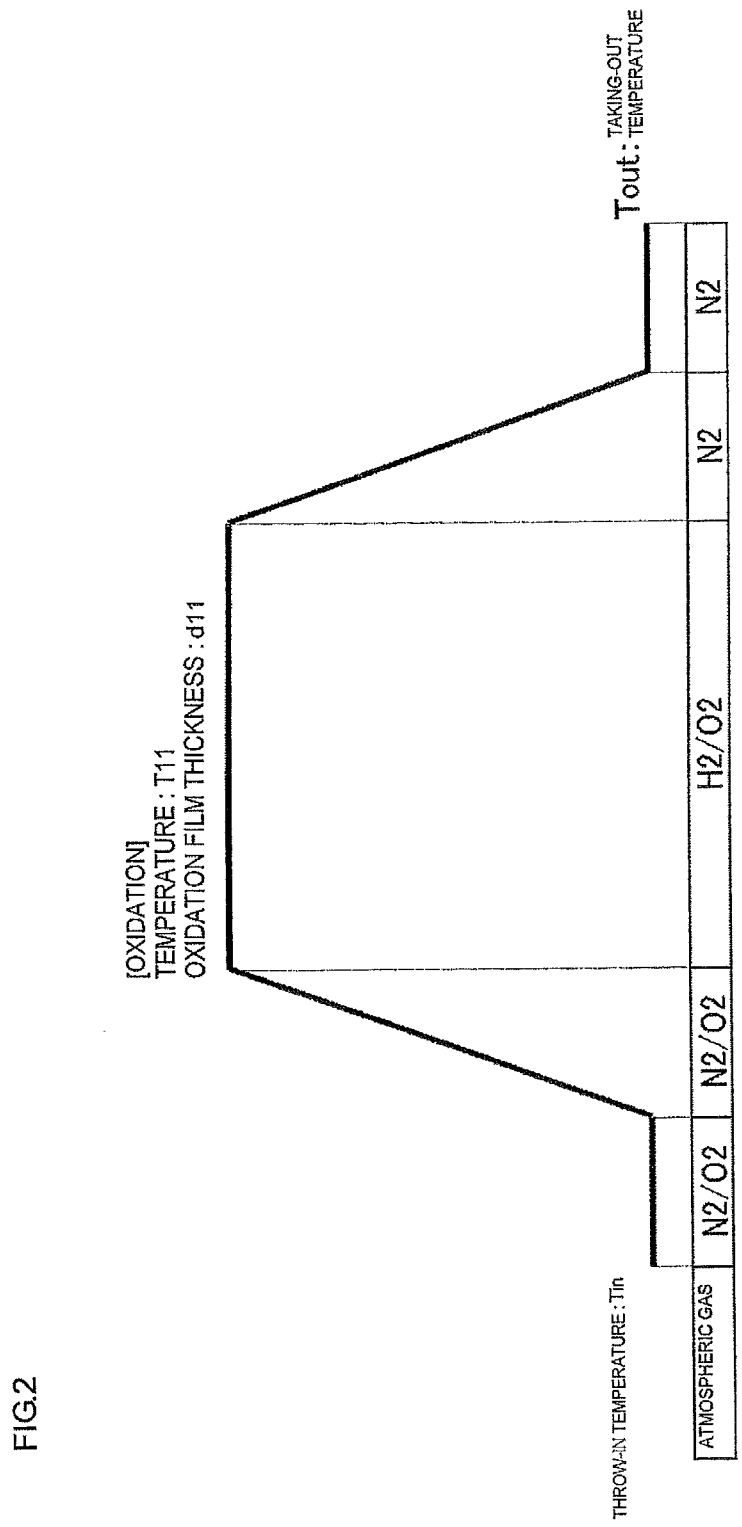
FIG. 2 is view showing temperature and atmospheric gas within a heat treatment furnace in comparative examples 1, 2.

A mirror polished silicon single crystal wafer having a diameter of 200 mm and crystal orientation <100> was thrown into a longitudinal heat treatment furnace to form an oxide film having a thickness of 6000 nm by the heat treatment profile of FIG. 2. In the table 3, there are shown throw-in temperature Tin(° C.), oxidation temperature T11(° C.), and taking out temperature Tout(° C.) in this instance.

In addition, the temperature-elevating rate and the temperature-lowering rate were set to the same condition as those at the time of the high temperature oxidation of Example 1.

The thermal oxide film having a thickness of 6000 nm was formed thereafter to observe the slip dislocation by the X-ray topography method. As a result, a strong linear slip dislocation having, as base point, contact trace with respect to the wafer boat was observed as crossing mark.

Comparative Example 2

A mirror polished silicon single crystal wafer having a diameter of 200 mm and crystal orientation <100> was thrown into a longitudinal heat treatment furnace to form an oxide film having a thickness of 2500 nm by the heat treatment profile of FIG. 2. In Table 3, there are shown throw-in temperature Tin(° C.), oxidation temperature T11(° C.) and taking-out temperature Tout(° C.) in this instance.

In addition, the temperature-elevating rate and temperature-lowering rate were set to the same condition as those at the time of the high temperature oxidation of Example 3.

The thermal oxide film having a thickness of 2500 nm was formed thereafter to observe a slip dislocation by the X-ray topography. As a result, a linear slip dislocation having, as base point, contact trace with respect to wafer boat was observed as crossing mark.

The temperatures at the time of forming thermal oxide films in Comparative Examples 1, 2 are shown in the Table 3, and the thermal oxide film thicknesses in Comparative Examples 1, 2 are shown in Table 4.

TABLE 3

|  | Tin (° C.) | T11 (° C.) | Tout (° C.) |
|---|---|---|---|
| Comparative Example 1 | 500 | 1250 | 500 |
| Comparative Example 2 | 500 | 1200 | 500 |

TABLE 4

|  | Oxidation d11 (nm) |
|---|---|
| Comparative Example 1 | 6000 |
| Comparative Example 2 | 2500 |

Comparative Example 3

Figure 3:
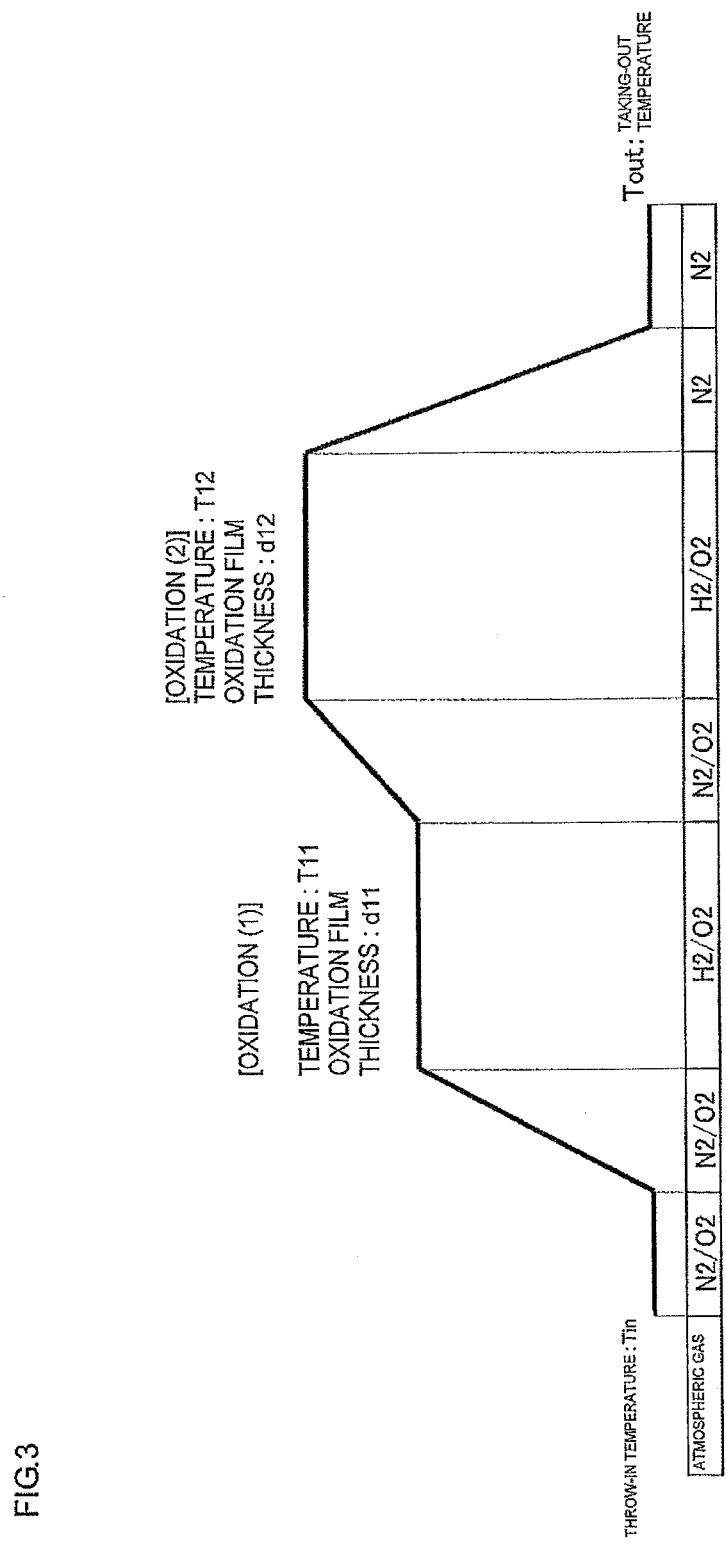
FIG. 3 is a view showing temperature and atmospheric gas within a heat treatment furnace in a comparative example 3.

A mirror polished silicon single crystal wafer having a diameter of 200 mm and crystal orientation <100> was thrown into a longitudinal heat treatment furnace to form a thermal oxide film having a thickness of 6000 nm by the heat treatment profile, as described in FIG. 3, having double-stage heat treatment in which temperature elevating is performed without temperature lowering between heat treatments of the preceding stage and the succeeding stage. In Table 5, there are shown throw-in temperature Tin(° C.), oxidation temperatures T11, T12 (° C.) and taking-out temperature Tout(° C.). The oxidation was performed by the pyrogenic oxidation. In the case of low temperature oxidation (oxidation 1), oxidation time was adjusted so that a thermal oxide film having a thickness 1000 nm is formed. In the case of the high temperature oxidation (oxidation 2), oxidation time was adjusted so that a thermal oxide film having a thickness 5000 nm is additionally formed.

In addition, the temperature-elevating rate and the temperature-lowering rate were set to the same conditions as those of Example 1.

A thermal oxide film having a thickness of 6000 nm was formed thereafter to observe slip dislocation by the X-ray topography method. As a result, a strong linear slip dislocation (weak (short) as compared to Comparative Example 1) having, as base point, contact trace with respect to wafer boat was observed as crossing mark.

The temperatures at the time of forming thermal oxide film in Comparative Example 3 are shown in Table 5, and the thermal oxide film thicknesses in Comparative Example 3 are illustrated in Table 6.

TABLE 5

|  | Tin (° C.) | T11 (° C.) | T12 (° C.) | Tout (° C.) |
|---|---|---|---|---|
| Comparative Example 3 | 500 | 1050 | 1250 | 500 |

TABLE 6

|  | Oxidation (1) d11 (nm) | Oxidation (2) d12 (nm) | Total oxide film thickness |
|---|---|---|---|
| Comparative Example 3 | 1000 | 5000 | 6000 nm |

It is to be noted that the present invention is not restricted to the foregoing embodiment. The foregoing embodiment is just an exemplification, and any examples that have substantially the same configuration and demonstrate the same functions and effects as the technical concept described in claims of the present invention are included in the technical scope of the present invention.

The invention claimed is:

1. A method of forming a thermal oxide film on a silicon single crystal wafer, comprising:
    placing the silicon single crystal wafer into a heat treatment furnace at a starting temperature;
    elevating a temperature of the heat treatment furnace from the starting temperature up to a temperature T1 where a thermal oxide film is formed to form a thermal oxide film having a thickness d1 of 500 nm or more;
    subsequently lowering the temperature of the heat treatment furnace down to a temperature equal to or less than the starting temperature and lower than the temperature T1 by 200° C. or more; and thereafter
    elevating the temperature of the heat treatment furnace up to a temperature T2 higher than the temperature T1 without having taken the silicon single crystal wafer out of the heat treatment furnace to additionally form a thermal oxide film having a thickness d2 thicker than the thickness d1.

2. The method of forming a thermal oxide film on a silicon single crystal wafer according to claim 1,
    wherein the temperature T1 is set to a temperature lower than 1200° C., and the temperature T2 is set to a temperature of 1200° C. or more.

3. The method of forming a thermal oxide film on a silicon single crystal wafer according to claim 1,
    wherein a film thickness obtained by totalizing the thickness d1 and the thickness d2 is 2500 nm or more.

4. The method of forming a thermal oxide film on a silicon single crystal wafer according to claim 1, further comprising:
    after the thermal oxide film having the thickness d2 is additionally formed, additionally forming a thermal oxide film by performing the steps of (i) lowering the temperature of the heat treatment furnace down to a temperature lower than the temperature T1, and (ii) thereafter elevating the temperature of the heat treatment furnace up to a temperature higher than the temperature T1 is repeated, one or more times.

* * * * *